US009312044B2

(12) United States Patent
He et al.

(10) Patent No.: US 9,312,044 B2
(45) Date of Patent: Apr. 12, 2016

(54) SEMICONDUCTING FUSED THIOPHENE POLYMER INK FORMULATION

(71) Applicant: Corning Incorporated, Corning, NY (US)

(72) Inventors: Mingqian He, Horseheads, NY (US); James Robert Matthews, Painted Post, NY (US)

(73) Assignee: Corning Incoporated, Corning, NY (US)

( * ) Notice: Subject to any disclaimer, the term of this patent is extended or adjusted under 35 U.S.C. 154(b) by 0 days.

(21) Appl. No.: 14/421,240

(22) PCT Filed: Aug. 20, 2013

(86) PCT No.: PCT/US2013/055674
§ 371 (c)(1),
(2) Date: Feb. 12, 2015

(87) PCT Pub. No.: WO2014/035716
PCT Pub. Date: Mar. 6, 2014

(65) Prior Publication Data
US 2015/0206616 A1   Jul. 23, 2015

Related U.S. Application Data

(60) Provisional application No. 61/693,488, filed on Aug. 27, 2012.

(51) Int. Cl.
*C08G 75/00* (2006.01)
*H01B 1/12* (2006.01)
(Continued)

(52) U.S. Cl.
CPC ............. *H01B 1/127* (2013.01); *C08G 61/126* (2013.01); *C09D 11/52* (2013.01); *C09D 165/00* (2013.01);
(Continued)

(58) Field of Classification Search
CPC .......... C08G 61/126; C08G 2261/124; C08G 2261/95; C08G 2261/91
USPC .................. 528/377, 378, 380, 370, 375, 376
See application file for complete search history.

(56) References Cited

U.S. PATENT DOCUMENTS 4,737,557 A   4/1988   Sato et al.
5,069,823 A   12/1991  Sato et al.
(Continued)

FOREIGN PATENT DOCUMENTS

WO   2005112144   11/2005
WO   2006/031893  3/2006
(Continued)

OTHER PUBLICATIONS

Natalis et al., Nature, 197, 284,1963.*
(Continued)

*Primary Examiner* — Shane Fang
(74) *Attorney, Agent, or Firm* — John L. Haack

(57) ABSTRACT

A formulation including: an organic semiconducting polymer selected from the diketopyrrolopyrrole (DPP) and fused thiophene co-polymer structures of the formulas (I), (II), or combinations thereof, or salts thereof, in an amount of from 0.1 to 5 wt % based on the total weight of the formulation: formulas (I) and (II), respectively, where m is an integer from 1 to 2, n is an integer from 4 to 80, X and Y are independently selected from a divalent heteroaryl, such as a thiophene, $R_1$, $R_2$, $R_3$, and $R_4$ is each a hydrocarbylene substituent as defined herein, a first solvent is selected from a cyclic aliphatic in an amount of from 2 to 98 wt %; and a second solvent selected from an aromatic in an amount of from 98 to 2 wt %. Also disclosed are method of making and using the disclosed formulations, for example, for use in electronic devices.

13 Claims, 3 Drawing Sheets

(51) Int. Cl.
*C09D 165/00* (2006.01)
*C08G 61/12* (2006.01)
*C09D 11/52* (2014.01)
*H01B 13/00* (2006.01)
*H01L 51/00* (2006.01)
*H01L 51/05* (2006.01)

(52) U.S. Cl.
CPC ........ H01B 13/0026 (2013.01); H01L 51/0036 (2013.01); *C08G 2261/124* (2013.01); *C08G 2261/1412* (2013.01); *C08G 2261/3223* (2013.01); *C08G 2261/3243* (2013.01); *C08G 2261/344* (2013.01); *C08G 2261/364* (2013.01); *C08G 2261/92* (2013.01); *H01L 51/0007* (2013.01); *H01L 51/0558* (2013.01)

(56) References Cited

U.S. PATENT DOCUMENTS

| | | | |
|---|---|---|---|
| 5,814,376 | A | 9/1998 | Cabelli |
| 7,510,672 | B2 | 3/2009 | McCulloch et al. |
| 7,601,279 | B2 | 10/2009 | Masuda |
| 7,838,623 | B2 | 11/2010 | He |
| 8,846,855 | B2 | 9/2014 | He et al. |
| 2003/0116772 | A1 | 6/2003 | Yamazaki et al. |
| 2007/0145324 | A1 | 6/2007 | Masuda |
| 2007/0161776 | A1* | 7/2007 | He ............................... 528/373 |
| 2011/0098478 | A1* | 4/2011 | He et al. ....................... 548/105 |
| 2011/0215313 | A1* | 9/2011 | Duggeli et al. ................ 257/40 |
| 2012/0161117 | A1* | 6/2012 | Chen et al. .................... 257/40 |
| 2013/0085256 | A1 | 4/2013 | He et al. |

FOREIGN PATENT DOCUMENTS

| | | |
|---|---|---|
| WO | 2008/106019 | 9/2008 |
| WO | 2009/123695 | 10/2009 |
| WO | 2011149804 | 12/2011 |
| WO | 2012118635 | 9/2012 |

OTHER PUBLICATIONS

Xinran Zhang, at al., "Molecular Packing of High-Mobility Diketo Pyrrolo-Pyrrole Polymer Semiconductors with Branched Alkyl Side Chains", J. Am. Chem. Soc., 2011, 133, 15073-15084.

H. Sirringhaus, et al., "Two-dimensional charge transport in self-organized, high-mobility conjugated polymers", Letters to Nature, Nature, vol. 401, October 14, 1999, 685-688.

Hugo Bronstein, et al., "Thieno[3,2-b]thiophene-Diketopyrrolopyrrole-Containing Polymers for High-Performance Organic Field-Effect Transistors and Organic Photovoltaic Devices", J. Am. Chem. Soc. , 2011, 133, 3272-3275.

Mingqian He, et al., "Alkylsubstituted Thienothiophene Semiconducting Materials: Structure-Property Relationships", J. Am. Chem. Soc., 2009, 131, 11930-11938.

Yuning Li, et al., "A High Mobility P-Type DPP-Thieno[3,2-b]thiophene Copolymer for Organic Thin-Film Transistors", Adv. Mater., 2010, 22, 4862-4866.

Howard E. Katz, "Recent Advances in Semiconductor Performance and Printing Processes for Organic Transistor-Based Electronics", Chem. Mater., 2004, 16, 4748-4756.

Mingqian He, et al., "Synthesis and Structure of Alkyl-Substituted Fused Thiophenes Containing up to Seven Rings", J. Org. Chem., 2007, 72, 442-451.

Hon Hang Fong, el al., "Tetrathienoacene Copolymers as High Mobility, Soluble Organic Semiconductors", J. Am. Chem. Soc. , 2008, 130, 13202-13203.

Zhuoying Chen, et al., "High-Performance Ambipolar Diketopyrrolopyrrole-Thieno[3,2-b]thiophene Copolymer Field-Effect Transistors with Balanced Hole and Electron Mobilities", Adv. Mater., 2012, 24, 647-652.

Bernd Tieke, et al., "Conjugated polymers containing diketopyrrolopyrrole units in the main chain", Beilstein J. Org. Chem. , 2010, 6, 830-845.

Sybille Allard, et al., Organic Semiconductors for Solution-Processable Field-Effect Transistors (OFETs), Angew. Chem. Int. Ed., 2008, 47, 4070-4098.

Organic Field-Effect Transistors, 181 ed., Bao, Z.; Locklin, J., CRC Press: Boca Raton, FL, 2007—book.

* cited by examiner

SEMICONDUCTING FUSED THIOPHENE POLYMER INK FORMULATION

This application claims the benefit of priority to U.S. Application No. 61/693,488 filed on Aug. 27, 2012 the content of which is incorporated herein by reference in its entirety.

The entire disclosure of any publication or patent document mentioned herein is incorporated by reference.

CROSS-REFERENCE TO RELATED APPLICATIONS

This application also is related commonly owned and assigned, U.S. Pat. No. 7,705,108, to He, M., et al., entitled "FUSED THIOPHENES, METHODS FOR MAKING FUSED THIOPHENES, AND USES THEREOF," and U.S. patent application Ser. No. 12/781,291, to He, M., et al., entitled "METHOD OF MAKING AN ORGANIC SEMI-CONDUCTOR DEVICE," filed May 17, 2010, and to U.S. Pat. Application 61/349,079, now US Pat. Publication 20110291054, to He, M., et al., entitled "POLYMERIC FUSED THIOPHENE SEMICONDUCTOR FORMULA-TION," filed May 27, 2010, but the present application does not claim priority to these related applications.

BACKGROUND

The disclosure relates generally to printable ink formulations including semiconducting polymers.

SUMMARY

The present disclosure provides formulations comprising a semiconducting polymer, which formulations are suitable for the preparation of electronic devices such as thin film transistors (TFT) and OFETs.

The present disclosure provides organic semiconductors formulations comprising solutions of the organic semiconductors, in particular, fused thiophene diketopyrrolopyrrole (DPP) copolymers. The disclosed formulations can have relatively low viscosity properties, which makes the formulations attractive for certain printable ink applications.

The present disclosure provides formulations and methods of deposition for use with low viscosity ink compositions. The disclosed formulations can have relatively low viscosity properties, which makes the formulations attractive for certain printable ink applications.

The present disclosure provides methods of making and methods of use of the formulations in the manufacture of electronic components or electronic devices.

The present disclosure provides methods of making and using the organic semiconductor formulations comprising a solution of one or more organic semiconductor compounds.

The present disclosure provides a solution that comprises a selected solvent mixture in combination with one or more organic semiconductor compounds. The disclosed combination of solvents, having at least one aromatic component and at least one other non-aromatic component, have a longer shelf-life time. During the shelf life the formulations viscosity does not increase significantly, which means the there is little or no appearance of gel or precipitation and the formulations remain useable within a reasonable time frame. The one or more organic semiconductor compound can be, for example, a fused thiophene diketopyrrolopyrrole based copolymer as defined herein, and like compounds.

The present disclosure provides formulations and methods of making and use of the formulations, where the formulations do not form gels during practical time intervals, for example, when stored at room temperature, for example, from about 2 days to 7 days, from 3 days to 14 days, or more. The time to gel of an ink formulation is highly dependent on the concentration of the organic semiconductor compound. For 5 mg/mL sample concentrations, the longest lived formulation without gelation was a combination of toluene and decalin having a solution life greater than 14 days. For 3 mg/mL sample concentrations, certain other solvent combinations lasted beyond 14 days, and included combinations of toluene and decalin. These formulations can have some increase in gel content over time but do not fully gel. For lower sample concentrations, such as 1mg/mL, solvent combinations can be selected to entirely avoid formulation precipitation since many combinations can last well beyond 2 weeks with no observable viscosity change.

The present disclosure provides formulas (I) and (II) that are representative of two related general copolymer structures comprised of diketopyrrolopyrrole (DPP) and fused thiophene monomers:

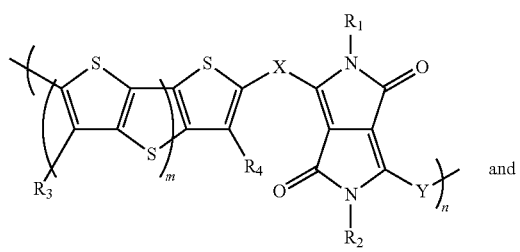

(I)

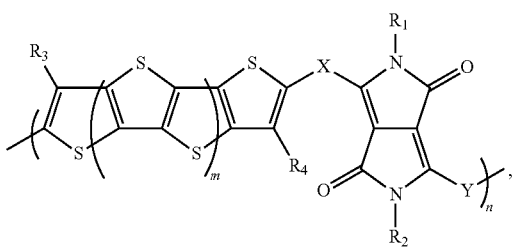

(II)

respectively, where m is an integer from 1 to 2, n is an integer from 4 to 80, and $R_1$, $R_2$, $R_3$, and $R_4$ is each a hydrocarbylene substituent independently selected from a group having a saturated or unsaturated, branched or unbranched, substituted or unsubstituted ($C_{10-20}$)hydrocarbylene further substituted with a saturated or unsaturated cyclic ($C_{3-10}$)hydrocarbylene.

A specific structure of a diketopyrrolopyrrole (DPP) and fused thiophene copolymer is of the formula (III):

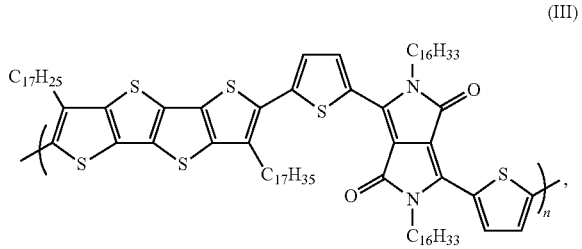

(III)

where n is an integer from 6 to 60, having an Mn of about 15000 to 20000, and an Mw of about 40,000 to 60,000.

"PTDC16DPPTDC17FT4" as used herein is a shorthand or coded designation for the polymer structure of formula (III) representing in order of occurrence from right to left: the "P" is a polymer comprised of at least one "T" or thiophene unit, the "DC16DPP" is a diketopyrrolopyrrole (DPP) having N,N'-substitutents of two $C_{16}H_{33}$ groups, "T" is for an intervening thiophene, DC17FT4 for a fused thiophene having four fused rings (FT4) and having two $C_{17}H_{35}$ groups or chains as β-substituents or on the β positions of the FT4 portion.

BRIEF DESCRIPTION OF THE DRAWINGS

In embodiments of the disclosure.

DETAILED DESCRIPTION

Figure 1:
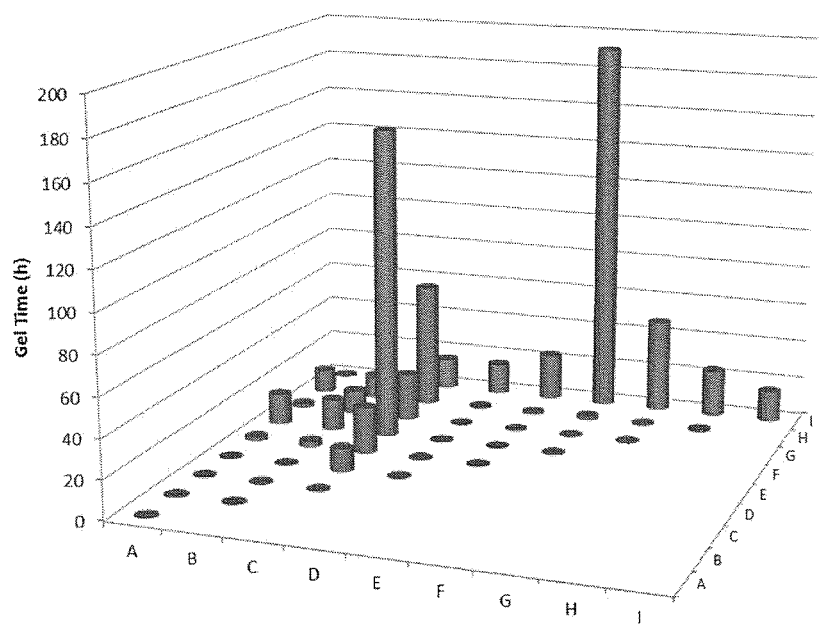
FIG. 1 provides a graphic representation of the experimental results listed in Table 1.

Various embodiments of the disclosure will be described in detail with reference to drawings, if any. Reference to various embodiments does not limit the scope of the invention, which is limited only by the scope of the claims attached hereto. Additionally, any example(s) set forth in this specification are not limiting and merely set forth some of the many possible embodiments of the claimed invention.

Definitions

"FTx" or like abbreviations can refer to a fused thiophene compound, polymerizable monomers thereof, and polymers thereof, where x is an integer indicating the number of fused thiophene ring or cycle units fused into a single core unit, for example, an FT2 has two fused rings in the core unit, an FT3 has three fused rings in the core unit, an FT4 has four fused rings in the core unit, an FT5 has five fused rings in the core unit, and like higher designations in the core unit.

"Hydrocarbon," "hydrocarbyl," "hydrocarbylene," "hydrocarbyloxy," and like terms generally refer to monovalent, such as —R, or divalent —R— moieties, and can include, for example, alkyl hydrocarbons, aromatic or aryl hydrocarbons, alkyl substituted aryl hydrocarbons, alkoxy substituted aryl hydrocarbons, heteroalkyl hydrocarbons, heteroaromatic or heteroaryl hydrocarbons, alkyl substituted heteroaryl hydrocarbons, alkoxy substituted heteroaryl hydrocarbons, and like hydrocarbon moieties, and as illustrated herein.

"Ring," "cycle," "cyclic," or like terms generally refer to at least one continuous closed loop or chain of atoms and can include, for example, saturated alicyclics, unsaturated alicyclics, aromatics, hetero-aromatics (heteroaryl), and like cyclic classifications, or combinations thereof, including monocyclic, bicyclic, tricyclic, and like conventional designations.

"Alkyl" includes linear alkyls, branched alkyls, and cycloalkyls. "Substituted alkyl" or "optionally substituted alkyl" refers to an alkyl substituent, which can include, for example, a linear alkyl, a branched alkyl, or a cycloalkyl, having from 1 to 4 optional substituents selected from, for example, hydroxyl (—OH), halogen, amino (—NH$_2$ or —NR$_2$), nitro (—NO$_2$), acyl (—C(=O)R), alkylsulfonyl (—S(=O)$_2$R), alkoxy (—OR), (C$_{3-10}$)cycloalkyl, and like substituents, where R is a hydrocarbyl, aryl, Het, or like moieties, such as a monovalent alkyl or a divalent alkylene having from 1 to about 10 carbon atoms. For example, a hydroxy substituted alkyl, can be a 2-hydroxy substituted propylene of the formula —CH$_2$—CH(OH)—CH$_2$—, an alkoxy substituted alkyl, can be a 2-methoxy substituted ethyl of the formula —CH$_2$—CH$_2$—O—CH$_3$, an amino substituted alkyl, can be a 1-dialkylamino substituted ethyl of the formula —CH(NR$_2$)—CH$_3$, an oligo-(oxyalkylene), poly-(oxyalkylene), or poly-(alkylene oxide) substituted alkyl, can be, for example, of the partial formula —(R—O)$_x$—, where x can be, for example, from 1 to about 50, and from 1 to about 20, and like substituted oxyalkylene substituents, such as of the formula —(CR$^5$—CHR$^5$—O)$_x$— where R$^5$ is hydrogen or a substituted or unsubstituted (C$_{1-8}$) hydrocarbyl such as alkyl, and x is an integer of from 1 to about 50.

"Aryl" includes a mono- or divalent-phenyl radical or an ortho-fused bicyclic carbocyclic radical having about nine to twenty ring atoms in which at least one ring is aromatic. Aryl (Ar) can include substituted aryls, such as a phenyl radical having from 1 to 5 substituents, for example, alkyl, alkoxy, halo, and like substituents.

"Het" includes a four-(4), five-(5), six-(6), or seven-(7) membered saturated or unsaturated heterocyclic ring having 1, 2, 3, or 4 heteroatoms selected from the group consisting of oxy, thio, sulfinyl, sulfonyl, selenium, tellurium, and nitrogen, which ring is optionally fused to a benzene ring. Het also includes "heteroaryl," which encompasses a radical attached via a ring carbon of a monocyclic aromatic ring containing five or six ring atoms consisting of carbon and 1, 2, 3, or 4 heteroatoms each selected from the group consisting of non-peroxide oxy, thio, and N(X) wherein X is absent or is H, O, (C$_{1-4}$)alkyl, phenyl, or benzyl, and a radical of an ortho-fused bicyclic heterocycle of about eight to ten ring atoms derived therefrom, particularly a benzo-derivative or one derived by fusing a propylene, trimethylene, or tetramethylene diradical thereto.

In embodiments, halo or halide includes fluoro, chloro, bromo, or iodo. Alkyl, alkoxy, etc., include both straight and branched groups; but reference to an individual radical such as "propyl" embraces only the straight chain radical, a branched chain isomer such as "isopropyl" being specifically referred to.

The carbon atom content of various hydrocarbon-containing (i.e., hydrocarbyl) moieties can alternatively be indicated by a prefix designating a lower and upper number of carbon atoms in the moiety, i.e., the prefix C$_{i-j}$ indicates a moiety of the integer "i" to the integer "j" carbon atoms, inclusive. Thus, for example, (C$_1$-C$_8$)alkyl or C$_{1-8}$alkyl refers to an alkyl of one to eight carbon atoms, inclusive, and hydrocarbyloxy such as (C$_1$-C$_8$)alkoxy or C$_{1-8}$alkoxy refers to an alkoxy radical (—OR) having an alkyl group of one to eight carbon atoms, inclusive.

Specifically, a C$_{1-8}$alkyl can be, for example, methyl, ethyl, propyl, isopropyl, butyl, iso-butyl, sec-butyl, tert-butyl, pentyl, 3-pentyl, hexyl, heptyl, or octyl; (C$_{3-12}$)cycloalkyl can be cyclopropyl, cyclobutyl, cyclopentyl, cyclohexyl, cycloheptyl, cyclooctyl, including bicyclic, tricyclic, or multi-cyclic substituents, and like substituents.

A specific "hydrocarbyl" can be, for example, (C$_{10-20}$) hydrocarbyl, including all intermediate chain lengths and values, and (C$_{3-12}$)cyclohydrocarbyl including all intermediate values and ring sizes.

C$_{1-8}$alkoxy can be, for example, methoxy, ethoxy, propoxy, isopropoxy, butoxy, iso-butoxy, sec-butoxy, pentoxy, 3-pentoxy, hexyloxy, 1-methylhexyloxy, heptyloxy, octyloxy, and like substituents.

A —C(=O)(C$_{3-7}$)alkyl- or —(C$_{2-7}$)alkanoyl can be, for example, acetyl, propanoyl, butanoyl, pentanoyl, 4-methylpentanoyl, hexanoyl, or heptanoyl. Aryl (Ar) can be, for example, phenyl, naphthyl, anthracenyl, phenanthrenyl, fluorenyl, tetrahydronaphthyl, or indanyl. Het can be, for example, pyrrolidinyl, piperidinyl, morpholinyl, thiomorpholinyl, or heteroaryl. Heteroaryl can be, for example, furyl, imidazolyl, triazolyl, triazinyl, oxazoyl, isoxazoyl, thiazolyl, isothiazoyl, pyrazolyl, pyrrolyl, pyrazinyl, tetrazolyl, pyridyl, (or its N-oxide), thienyl, pyrimidinyl (or its N-oxide), indolyl, isoquinolyl (or its N-oxide) or quinolyl (or its N-oxide).

Other conditions suitable for formation and modification of the compounds, oligomers, polymers, composites, or like products of the disclosure, from a variety of starting materials or intermediates, as disclosed and illustrated herein are available. For example, see Feiser and Feiser, "Reagents for Organic Synthesis", Vol. 1, et seq., 1967; March, J. "Advanced Organic Chemistry," John Wiley & Sons, 4$^{th}$ ed. 1992; House, H. O., "Modern Synthetic Reactions," 2$^{nd}$ ed., W. A. Benjamin, New York, 1972; and Larock, R. C., "Comprehensive Organic Transformations," 2$^{nd}$ ed., 1999, Wiley-VCH Publishers, New York. The starting materials employed in the preparative methods described herein are, for example, commercially available, have been reported in the scientific literature, or can be prepared from readily available starting materials using procedures known in the field. It may be desirable to optionally use a protecting group during all or portions of the above described or alternative preparative procedures. Such protecting groups and methods for their introduction and removal are known in the art. See Greene, T. W.; Wutz, P. G. M. "Protecting Groups In Organic Synthesis," 2$^{nd}$ ed., 1991, New York, John Wiley & Sons, Inc.

"Monomer," "mer," or like terms refer to a compound that can be (or has already been) covalently combined or linked with other monomers of like or different structure to form homogenous (homopolymers) or heterogeneous (e.g., copolymers, terpolymers, and like heteropolymers) chains of the target polymer. Suitable monomers as disclosed and illustrated herein or incorporated by reference can include, for example, low molecular weight polymerizable compounds, such as from about 50 to about 200 Daltons, and higher molecular weight compounds, such as from about 200 to about 10,000 Daltons, including unsaturated oligomeric or unsaturated polymeric compounds.

"Include," "includes," or like terms means encompassing but not limited to, that is, inclusive and not exclusive.

"About" modifying, for example, the quantity of an ingredient in a composition, concentrations, volumes, process temperature, process time, yields, flow rates, pressures, and like values, and ranges thereof, employed in describing the embodiments of the disclosure, refers to variation in the numerical quantity that can occur, for example: through typical measuring and handling procedures used for making compounds, compositions, composites, concentrates or use formulations; through inadvertent error in these procedures; through differences in the manufacture, source, or purity of starting materials or ingredients used to carry out the methods; and like considerations. The term "about" also encompasses amounts that differ due to aging of a composition or formulation with a particular initial concentration or mixture, and amounts that differ due to mixing or processing a composition or formulation with a particular initial concentration or mixture. The claims appended hereto include equivalents of these "about" quantities.

"Consisting essentially of" in embodiments refers, for example, to a formulation or composition, and articles, devices, or any apparatus of the disclosure, and can include the components or steps listed in the claim, plus other components or steps that do not materially affect the basic and novel properties of the compositions, articles, apparatus, or methods of making and use of the disclosure, such as particular reactants, particular additives or ingredients, a particular agent, a particular surface modifier or condition, or like structure, material, or process variable selected. Items that may materially affect the basic properties of the components or steps of the disclosure or that may impart undesirable characteristics to the present disclosure include, for example, no or very low compound solubility, extensive or protracted dissolution processing because of poor solubility, unnecessary exposure of the starting compounds, the polymers, or the resulting coated semiconductor articles or devices to excessively high temperatures, and like contrary steps.

The indefinite article "a" or "an" and its corresponding definite article "the" as used herein means at least one, or one or more, unless specified otherwise.

Abbreviations, which are well known to one of ordinary skill in the art, may be used (e.g., "h" or "hr" for hour or hours, "g" or "gm" for gram(s), "mL" for milliliters, and "rt" for room temperature, "nm" for nanometers, "bp" for boiling point, and like abbreviations).

Specific and preferred values disclosed for components, ingredients, additives, and like aspects, and ranges thereof, are for illustration only; they do not exclude other defined values or other values within defined ranges. The formulations, compositions, devices, apparatus, and methods of the disclosure can include any value or any combination of the values, specific values, more specific values, and preferred values described herein.

The use of organic semiconductors as functional materials has become a reality in a number of different applications for the electronics industry including, for example, printed electronics, organic transistors (OTFTs, OFETs), organic light-emitting diodes (OLEDs), organic integrated circuits, and organic solar cells, among others (see Sirringhaus, H.; et al., Nature 1999, 401, 685; Allard, S.; et al., Angew. Chem. Int. Ed., 2008, 47, 4070; Organic Field-Effect Transistors, 1$^{st}$ ed., Bao, Z.; et al., CRC Press: Boca Raton, Fla., 2007).

Organic transistors can be used in, for example, smart cards, security tags, and the switching elements in the backplane of flat panel displays. Organic semiconductors are envisaged to substantially reduce the cost over their inorganic counterparts such as silicon, if they can be deposited from solution, as this enables fast, large-area fabrication routes such as spin-coating, ink-jet printing, gravure printing, transfer printing and other various printing processes (Katz, H. E., *Chem. Mater.*, 2004, 16, 4748).

The performance of an OFET device is usually evaluated by several parameters: charge carrier mobility, current On/Off ratio, threshold voltage and the magnitude of the On and Off current (see Katz, supra.). The ability to achieve high parameters from a solution deposition process with a minimum number of processing steps is considered to be a strong advantage. For this purpose, it is necessary to prepare stable inks or formulations of the organic semiconducting materials. Stable inks can improve the likelihood of reproducible and consistent device manufacture.

Recently, high performance semiconducting fused thiophene polymers have been reported (see Fong, H. H.; et al., *J. Am. Chem. Soc.*, 2008, 130, 13202; He, M.; et al., *J. Am. Chem. Soc.*, 2009, 131, 11930; He, M., et al., WO2009123695 A1; He, Mingqian, WO 2008 106019; He, Mingqian; WO 2006 031893; commonly owned and assigned US patent application 61/553,326 entitled "FUSED THIOPHENES, METHODS OF MAKING FUSED THIOPHENES, AND USES THEREOF;" and 61/553,331 entitled "CONJUGATED FUSED THIOPHENES, METHODS OF MAKING CONJUGATED FUSED THIOPHENES, AND USES THEREOF.").

Dialkylated tetrathienoacene (FT4) copolymers can be deposited from a dichlorobenzene solution to yield ordered films with a field-effect hole mobility that exceeds 1.5 $cm^2/V \cdot s$. This polymer enables simple transistor fabrication at relatively low temperatures, which is particularly important for the realization of large-area, mechanically flexible electronics.

Diketopyrrolopyrrole (DPP) based polymers that do not contain FT4 moieties have been developed and reported to exhibit high mobilities, such as >1 $cm^2/V \cdot s$ (see Bronstein, H.; et al., *J. Am. Chem. Soc.*, 2011, 133, 3272; Li, Y.; et al., *Adv. Mater.*, 2010, 22, 4862-4866; Tieke, B.; et al., *J. Org. Chem.*, 2010, 6, 830.). These polymers do not have the benefit of the very stable FT4 moiety, and do not contain two solubilizing substituents that enhance solvent processability. However, organic semiconducting materials, especially for polymeric semiconductors, generally have solubility limitations for two main reasons (see McCulloch, I.; et al., U.S. Pat. No. 7,510,672). Firstly, semiconducting polymers require a conjugated component, generally the backbone, to confer the appropriate electronic band gap. This backbone usually contains a high degree of aromatic hydrocarbon and heterocyclic rings, which tend to limit the solubility in coating solvents. Secondly, charge transport polymers are designed to facilitate intermolecular charge hopping, which is enhanced by close packing and aggregation of the polymer chains. Charge transport considerations require close packing of the conjugated regions of adjacent molecules once the molecules are in the film. If this close packing occurs in solution this can lead excessive aggregation and to low solubility. This can be prevented by attaching solubilizing groups to the monomers to enhance solute-solvent interactions over solute-solute interactions.

Therefore, it is desirable to have compositions or formulations comprising semiconducting polymers, such as certain fused thiophene containing polymers that have sufficient solubilizing groups for their conjugated backbone structure. Materials disclosed in, for example, commonly owned and assigned U.S. Patent Application Nos. 61/553,326 and 61/553,331, are examples of such materials, which are suitable for the preparation of electronic devices like TFT and OFETs. The semiconducting polymer formulations are preferably suited to spin-casting and printing processes. Compositions or formulations comprised of semiconducting polymers and organic solvents have been described, see for example U.S. Pat. Nos. 5,069,823 and 4,737,557 (both to Sato, et al.), which disclose poly-(3-alkylthiophene) (PAT), and methods of its preparation, and mention solutions of PAT in tetralin. US 2003/116772 to Yamazaki, S.; et al., discloses the fabrications of a light-emitting device from an organic light-emitting compound dissolved in a solvent by coating method. As possible organic compounds Yamazaki generally discloses polymers, such as polythiophene (PT), polyphenylenevinylene (PPV), polypyrrole (PP), or polyfluorene (PF).

U.S. Pat. No. 5,814,376(to Cabelli), discloses a gravure coating process for forming a film of an electroconductive polymer on a substrate. As possible polymers polyacetylene, polypyrrole, polythiophene, poly(3-alkyl)thiophene , polyphenylene sulfide, polyphenylenevinylene, polythienylene vinylene, polyphenylene, polyisothianaphthene, polyazulene, polyfuran or polyaniline are generally mentioned.

Ink formulations containing a semi-conducting polymer preferably have the right properties to create films of the semi-conducting polymer under the processing conditions prescribed in a variety of different application techniques, such as viscosity, evaporation rate, etc., and preferably also have reasonable shelf life. There are a multitude of possibilities for solvent combinations that can be made to satisfy the properties to create films of the desired quality. However, many of these ink formulations suffer from short room temperature shelf life before precipitation or gelation occurs. Some attempts to address the issue of solubility have been reported (see for example, U.S. Pat. No. 7,601,279, to Masuda).

The tendency for the polymer to aggregate often leads to precipitation. To counter this tendency many polymers are designed having a number of long solubilizing chains. An unfortunate additional property often imparted to the polymers is a propensity to gel many solvents that are suitable to dissolve the polymer species. The gelation issue must be overcome to avoid extra processing steps right before each use of an ink, which steps re-liquify the ink and restore viscosity to a usable and consistent range.

In embodiments, the disclosure provides organic semiconductor formulations comprising a solution of the organic semiconductor component, in particular, one or more fused thiophene diketopyrrolopyrrole co-polymers comprised of monomers of at least one fused thiophene and at least one diketopyrrolopyrrole. The solution of the organic semiconductor is comprised of mixtures of certain solvents. The certain solvent combinations can avoid gelation of the fused thiophene diketopyrrolopyrrole co-polymers when formulated into inks for use in, for example, deposition of thin films of the semiconductor polymers.

In embodiments, the disclosure provides a formulation comprising:

an organic semiconducting polymer selected from the diketopyrrolopyrrole (DPP) and fused thiophene copolymer structures of the formulas (I), (II), or combinations thereof, or salts thereof, in an amount of from 0.1 to 5 wt % based on the total weight of the formulation:

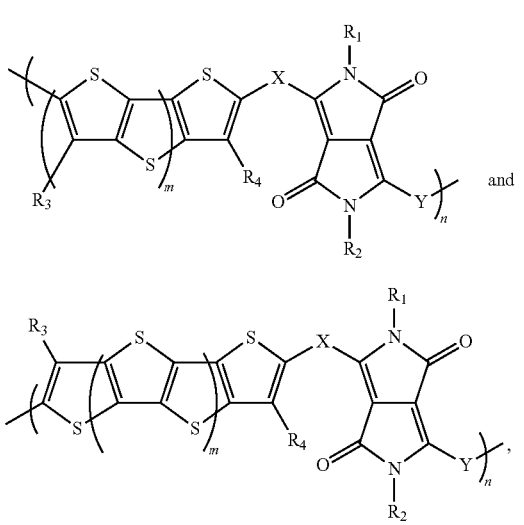

(I)

(II)

respectively,
where
m is an integer from 1 to 2,
n is an integer from 4 to 80,
X and Y are independently selected from a divalent heteroaryl, such as a thiophene or a substituted thiophene,
$R_1$, $R_2$, $R_3$, and $R_4$ is each a monovalent ($C_{20-50}$)hydrocarbylene substituent independently selected from a group of a saturated or unsaturated, a branched or unbranched, a substituted or unsubstituted hydrocarbylene further substituted with a saturated or unsaturated cyclic or acyclic ($C_{3-10}$)hydrocarbylene,
a first solvent selected from a cyclic aliphatic in an amount of from 2 to 98 wt % based on the total weight of the formulation; and
a second solvent selected from an aromatic in an amount of from 98 to 2 wt % based on the total weight of the formulation.

Typical use concentration of the selected organic semiconducting polymer of formula (I) can be, for example, from about 0.1 to about 0.5 wt %, from about 0.2 to about 0.45 wt %, from about 0.2 to about 0.4 wt %, from about 0.25 to about 0.35 wt %, including intermediate values and ranges. The higher the concentration of polymer the shorter the time before gelation may occur, with any of the selected solvent combinations.

Organic semiconducting polymers of formula (II) are generally better semi-conductor materials compared to polymers of formula (I) where m is the same in both structures. However, polymers of formula (I) generally have better solubilities compared to polymers of formula (II) where m is the same in both structures. In embodiments, the second solvent is necessarily different from the first solvent with the exception of those comparative same or single solvent formulations, and for the decalin mixed isomer solvent.

If one desires to forego the advantages of the disclosed non-halogentated solvent formulations (that is formulations free of halogenated solvents), a halogenated solvent can be selected and used in place of the non-halogentated solvent formulations.

In embodiments, the organic semiconducting polymer can be, for example, a diketopyrrolopyrrole (DPP) and fused thiophene copolymer structure of the Formula (III):

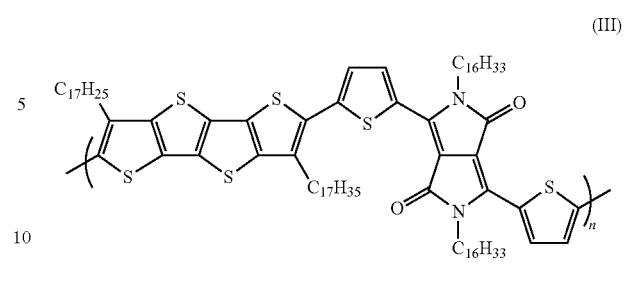

(III)

where
$R_1$ and $R_2$ of Formula (II) is each a —$C_{16}H_{33}$ hydrocarbylene,
$R_3$ and $R_4$ of Formula (II) is each a —$C_{17}H_{35}$ hydrocarbylene,
m is 1, and
n is an integer from 4 to 60, from 10 to 30, from 10 to 20, and from 10 to 15, including intermediate values and ranges.

In embodiments, the first cyclic aliphatic solvent can be selected from, for example, cis-decalin, trans-decalin, mixed cis- and trans-decalin, tetralin, cyclooctane, bicyclohexyl, or methylcyclohexane, in an amount of from 2 to 98 wt %, preferably about 50 to 70 wt %, and more preferably about 55 to 65 wt %, and more even preferably about 60 wt % based on the total weight of the formulation.

In embodiments, the second aromatic solvent can be selected, for example, from toluene, m-xylene, p-xylene, o-xylene, mesitylene, tetralin in an amount of from 98 to 2 wt %, preferably about 50 to 30 wt %, and more preferably about 45 to 35 wt %, and more even preferably about 40 wt %, based on the total weight of the formulation, and the weight ratio of the first solvent to the second solvent can be, for example, from 75:25 to 25:75.

In embodiments, the first solvent can be, for example, decalin, and the second solvent can be, for example, toluene, and the weight ratio of the first solvent to the second solvent can be, for example, 75:25 to 40:60.

In embodiments, the first solvent can be, for example, cyclooctane, and the second aromatic solvent can be, for example, tetralin, in a weight ratio of 75:25 to 40:60.

In embodiments, the first solvent can be cyclooctane, and the second aromatic solvent can be toluene, in a weight ratio of 75:25 to 40:60.

In embodiments, the shelf life before gelation of the solution at ambient conditions can be, for example, from 7 to 20 days, and from 14 to 20 days, or more.

In embodiments, the formulation can further comprise, for example, a viscosity modifier, a viscosity improver, a surface tension modifier, a fugitive surface tension modifier, a tenside, a surfactant, and like performance additives, or mixtures thereof.

In embodiments, the polydispersity of the polymer of formula (I) or (II) can be, for example, from about 1 to 3.

In embodiments, the polydispersity of the polymer of formula (III) can be, for example, from about 1.5 to 2.5, such as from about 1.8 to 2.2, from about 1.9 to 2.1, and like values, including intermediate values and ranges.

In embodiments, the volume ratio of the first solvent to the second solvent can be, for example, from 75:25 to 25:75, 70:30 to 30:70, 60:40 to 40:60, 55:45 to 45:55, including intermediate values and ranges.

In embodiments, the disclosure provides a method of making an electronic device, comprising:
depositing any of the disclosed formulations, alone or in any combination, on a suitable substrate.

In embodiments, the depositing can be accomplished using, for example, spin-coating, ink-jet printing, gravure printing, transfer printing, and like methods, or combinations thereof.

Experimental solvent systems are typically selected based on the solubility of the semi-conducting polymer in the solvent(s) and on the properties and quality of the films cast from such ink systems. However, most testing is done on a small scale with limited quantities of coating sample. Following the production of larger scale samples, such as for scale-up development, there can be a shift to larger scale ink formulation samples and device production. Larger quantities of ink need to be formulated to accomplish testing on larger substrates with multiple patterned devices. It has been discovered that many of the ink systems that were satisfactory for small scale preparation and immediate use are less than satisfactory when the ink system is made on a larger scale and stored for a time. For example, many devices made from PTDC16DPPTDC17FT4 of the structure of formula (III) can be made using m-xylene as the only solvent in the ink. This formulation provides coated product having good device performance on small scale testing. However, when larger ink volumes were made and stored for more than a day they appeared to be partially gelled on inspection. This gelation process can be reversed or arrested by, for example, heating and stirring the gelled formulation to make a usable ink again. However, the additional reconstitution step in going from the gel to a coat-able solution is undesirable. Ink formulations that can avoid such inconvenient gelation phenomena would be a significant ink formulation improvement.

A number of solvent combinations have been tested for resistance to gelation of solutions of PTDC16 DPPTDC17 FT4. These solvent combinations provided formulations that were practical film forming inks that were acceptable for making thin film transistor devices. Tables 1, 2, and 3 list formulations that include polymer-solution stability times over a period up to two weeks. A number of solutions at 1 mg/mL (Table 3) did not gel at all during the two week test period. However, at this low concentration two of the single solvent systems also survived un-gelled. This concentration is however on the lower end of what might practically be used in normal production applications for formation of films of the semi-conducting polymer. Higher concentrations are usually desired to both minimize solvent use and conserve solvent in large scale applications, and to obtain desired film thicknesses under reasonable processing conditions. At higher concentrations, such as 3 mg/mL (Table 2), some solutions, for example the mixtures of cyclooctane and toluene, or cyclooctane and m-xylene, did not gel for more than a week, which in many applications is sufficient to provide ample working time with a single batch of ink. Mixtures of, for example, decalin and toluene had the longest shelf life. Mixtures of cyclooctane and aromatic co-solvents generally tended to have greater solution shelf life before gelation than other combinations. This is in contrast to most ink formulations using a single solvent, where all solutions gelled within 1 to 2 hrs, which is significantly faster than mixed solvent systems at both 3 and 5 mg/mL concentrations. One single solvent ink formulations, consisting of only decalin, took longer than 2 hr to gel. This decalin solvent was actually a mixture of cis-decalin and trans-decalin. At the relatively high concentration of, for example, 5 mg/mL (Table 1) even the best solvent combinations evaluated eventually gelled after several days, such as from 2 to 8 days. By varying the ratio of the mixed solvents one can extend the time to gelation, for example, one combination consisting of decalin (cis +trans) mixed with toluene in a 6:4 weight ratio and used as the solvent for a 5 mg/mL polymer solution was stable against gelation through 15 days or more (at the time of this writing). However, the mixtures of an aromatic solvent and a non-aromatic solvent all significantly outperformed pure solvents or of like solvents, such as mixtures of different aromatic solvents, or mixtures of different non-aromatic solvents.

Certain processing systems for device making have shown pure xylenes to be good solvents from which to make devices when considering only device performance By mixing in cyclooctane, similar device performance can be maintained, while greatly extending ink shelf life. In the experimental sets tested, testing has been accomplished with 50:50 mixtures of solvents. Other suitable ratios of mixed solvents can be, for example, 60:40, and 75:25, including intermediate values and ranges. Published articles on other polymers based on the DPP moiety have all relied on chlorinated solvents (see Zhang, X.; et al., *J. Am. Chem. Soc.*, 2011, 133, 15073; and Chen, Z.; et al., *Adv. Mater.*, 2012, 24, 647). A rationale for use of chlorinated solvents was to avoid issues such as insolubility or gelation. However, chlorinated solvents are generally undesirable in many industrial application settings, since they tend to be subjected to more stringent controls by regulatory agencies due to their adverse health, environmental, and like effects relative to their non-chlorinated counterparts. The presently disclosed solvent systems, do not employ chlorinated solvents, avoid gelation, and are applicable to a broad range of DPP based polymers for semi-conducting polymeric applications.

EXAMPLES

The following example(s) serve to more fully describe the manner of using the above-described disclosure, and to further set forth the best modes contemplated for carrying out various aspects of the disclosure. It is understood that these examples do not limit the scope of this disclosure, but rather are presented for illustrative purposes. The working examples further describe how to prepare the formulations of the disclosure.

Ink Preparation

Example 1

Solution Preparation A solution of the PTDC16DPPTDC17FT4 polymer of the formula (III) was prepared by weighting the polymer into a vial then the mixed solvent s were added. The mixture was heated close to the boiling point of the solvent mixture, or the lower boiling point of the solvent pair, with agitation until fully dissolved. The ratio of polymer and solvent was from about 1 mg/mL to 5 mg/mL. The polymer is preferably completely dissolved in the solvent before the heated solution is cooled down to room temperature. Table 1 provides a listing of solvent combinations tested for gelation resistance in solutions of PTDC16DPPTDC17FT4 at 5 mg/mL or about 0.5 wt %. FIG. 1 provides a graphic representation of the experimental results listed in Table 1. All first and second solvent pairs had volume ratios of 1:1.

Some of the solvent combinations tested in Example 1 have solvent pair identity, that is where solvent 1=solvent 2. These serve as comparative examples, in that they all exhibit very short shelf life time before gelation compared to the mixtures of different solvents.

Figure 2:
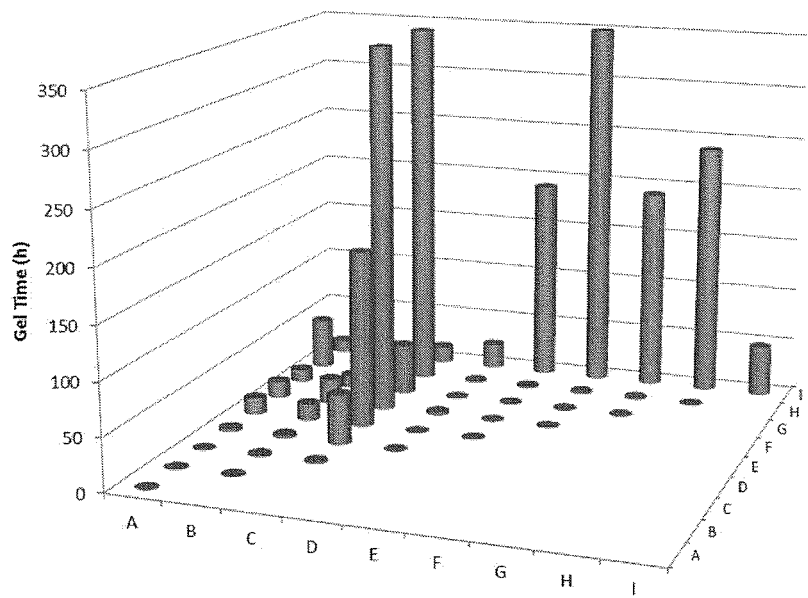
FIG. 2 provides a graphic representation of the experimental results listed in Table 2.

Table 2 provides a listing of solvent combinations tested for gelation resistance in solutions of PTDC16DPPTDC17FT4 at 3 mg/mL. FIG. 2 provides a graphic representation of the experimental results listed in Table 2.

Figure 3:
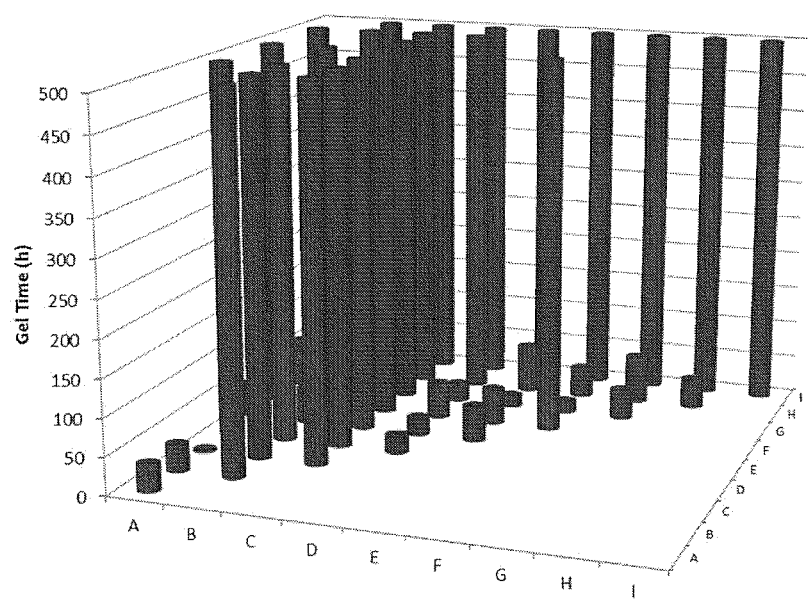
FIG. 3 provides a graphic representation of the experimental results listed in Table 3.

Table 3 provides a listing of solvent combinations tested for gelation resistance in solutions of PTDC16DPPTDC17FT4 at 1 mg/mL, or about 0.1 weight percent. FIG. 3 provides a graphic representation of the experimental results listed in Table 3.

Example 2

Figure 4:
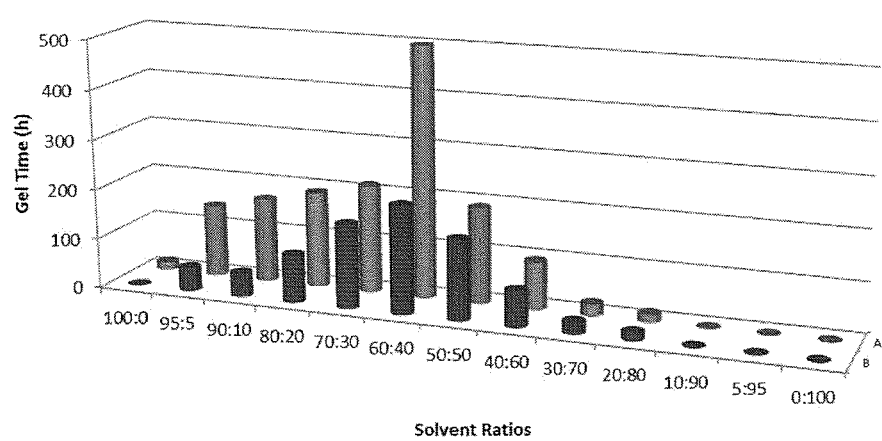
FIG. 4 provides a graphic representation of the experimental results listed in Table 4.

Solution Preparation A solution of the PTDC16DPPTDC17FT4 polymer of the formula (III) was prepared by weighting the polymer into a vial then the mixed solvent s were added. The mixture was heated close to the boiling point of the solvent mixture, or the lower boiling point of the solvent pair, with agitation until fully dissolved. The ratio of polymer to solvent was about 5 mg/mL. The polymer is preferably completely dissolved in the solvent before the heated solution is cooled down to room temperature. Table 4 provides a listing of solvent combinations and ratios of those solvents tested for gelation resistance in solutions of PTDC16DPPTDC17FT4 at 5 mg/mL or about 0.5 wt %. FIG. 4 provides a graphic representation of the experimental results listed in Table 4.

Example 3

Figure 5:
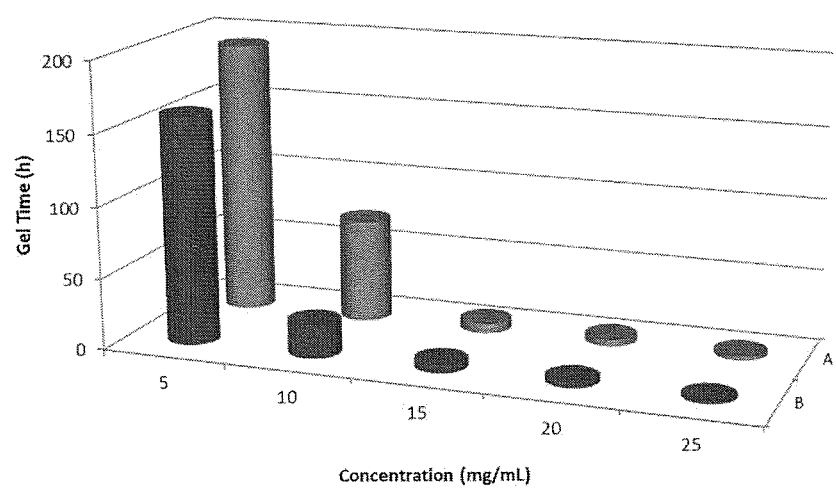
FIG. 5 provides a graphic representation of the experimental results listed in Table 5.

Solution Preparation A solution of the PTDC16DPPTDC17FT4 polymer of the formula (III) was prepared by weighting the polymer into a vial then the mixed solvents were added. The mixture was heated close to the boiling point of the solvent mixture, or the lower boiling point of the solvent pair, with agitation until fully dissolved. The ratio of polymer and solvent was varied from about 5 mg/mL to about 25 mg/mL. The polymer is preferably completely dissolved in the solvent before the heated solution is cooled down to room temperature. Table 5 provides a listing of solvent combinations and concentrations of polymer in those solvents tested for gelation resistance in solutions of PTDC16DPPTDC17FT4. FIG. 5 provides a graphic representation of the experimental results listed in Table 5.

Ink Application

Spin Coating For spin coating applications, where surface tension is not a significant concern the formulations of Example 1 were selected.

Gravure Printing For gravure printing applications formulations having higher viscosities and surface tensions, such as 20 to 25 dynes per centimeter, can be selected. Typically for a commercial gravure press, ink viscosities are in the range of 70 cps.

Surface tension can be a useful property to consider in formulating the disclosed formulations and in their use as specialty coatings. In spin-coat formulation applications it is desirable to match or approximate the surface energy of substrate and coating composition to facilitate wetting and avoiding drop fly-off. In ink jet formulation printing applications drop surface tensions that are too low can create droplet satellites or tails that can cause printed image and device defects.

Device Fabrication

Example 4

Thin film transistor fabrication Top-contact bottom-gate transistors using, for example, a fused thiophene copolymer, PTDC16DPPTDC17FT4, as the organic semiconducting channel were fabricated. Heavily doped Si<100> wafers were used as gate electrodes with a 300 nm thermally grown silicon dioxide as the gate dielectric. The substrates were cleaned by sonication in semiconductor grade acetone and isopropanol for 10 min in each solvent, and then given a 15 min air plasma treatment. Cleaned Si/SiO$_2$ samples were baked at about 200° C. for 15 min in a nitrogen atmosphere to achieve dehydration. Hexamethyl disilazane (HMDS) was used for surface modification of the gate dielectric layer. Polymer films were then deposited by spin-coating at 1000 rpm for 60 seconds. Three different sample sets were made, using inks with different solvent ratios, pure tetralin, 3:1 tetralin:p-xylene and pure p-xylene. The films were annealed on a hotplate at 190° C. in a nitrogen atmosphere to remove the solvent and promote alignment of the polymer, prior to thermal evaporation of top contact electrodes. 40 nm gold contacts for source and drain electrodes were vacuum-deposited at a rate of 2.5 Å/s through a metal shadow mask that defined a series of transistor devices with a channel length (L) of 50 micrometers and a channel width of 1 mm. Table 6 shows device mobility and threshold voltage data for the devices made in this way. The data indicates that shifting the solvent ratios does not adversely impact the performance of the devices made from the ink. Thus, it is possible to adjust the ink for better ink stability without sacrificing transistor performance.

Table 7 is key that lists the label designations for the solvents shown in FIGS. 1 to 3. Table 8 is key that lists the label designations for the solvent mixtures shown in FIGS. 4 and 5.

The disclosure has been described with reference to various specific embodiments and techniques. However, it should be understood that many variations and modifications are possible while remaining within the scope of the disclosure.

TABLE 1

Stability of PTDC16DPPTDC17FT4 solutions at 5 mg/mL.

| | Gel Times (h) Solvent 2 | | | | | | | | |
|---|---|---|---|---|---|---|---|---|---|
| Solvent 1 | Methylcyclohexane | Bicyclohexyl | Cyclooctane | Mesitylene | m-xylene | Toluene | p-Xylene | Tetralin | Decalin (cis + trans) |
| Decalin (cis + trans)[1] | <1 | 2 | <16 | <16 | 24 | 192 | 48 | 24 | <16 |
| Tetralin | <16 | <16 | 64 | <1 | <1 | 2 | <1 | <1 | —[2] |
| p-Xylene | 2 | <16 | 24 | <1 | <1 | <1 | <1 | — | — |
| Toluene | <16 | ~16 | ~60 | <1 | <1 | <1 | — | — | — |
| m-xylene | 2 | 3 | ~24 | <1 | <1 | — | — | — | — |
| Mesitylene | <1 | <1 | <16 | <1 | — | — | — | — | — |
| Cyclooctane | <1 | <1 | <1 | — | — | — | — | — | — |

TABLE 1-continued

Stability of PTDC16DPPTDC17FT4 solutions at 5 mg/mL.

| | Gel Times (h) Solvent 2 | | | | | | | | |
|---|---|---|---|---|---|---|---|---|---|
| Solvent 1 | Methylcyclohexane | Bicyclohexyl | Cyclooctane | Mesitylene | m-xylene | Toluene | p-Xylene | Tetralin | Decalin (cis + trans) |
| Bicyclohexyl | <1 | <1 | — | — | — | — | — | — | — |
| Methylcyclohexane | <1 | — | — | — | — | — | — | — | — |

[1]Purchased from Acros: product code 111840010. A mixture of cis- and trans-decalin.
[2]A "—" represents solvent mixtures that are duplicates of other cells in the table, that is, the ratio of solvent A to solvent B is 1:1, AB = BA.

TABLE 2

Stability of PTDC16DPPTDC17FT4 solutions at 3 mg/mL.

| | Gel Times (h) Solvent 2 | | | | | | | | |
|---|---|---|---|---|---|---|---|---|---|
| Solvent 1 | Methylcyclohexane | Bicyclohexyl | Cyclooctane | Mesitylene | m-xylene | Toluene | p-Xylene | Tetralin | Decalin (cis + trans) |
| Decalin (cis + trans) | <16 | <16 | 16 | 24 | 192 | >336* | 192 | 240 | 48 P |
| Tetralin | 48 | 24 | >336 | 2 | 2 | 2 | 2 | <1 | — |
| p-Xylene | <16 | <16 | 48 | <1 | <1 | <1 | <1 | — | — |
| Toluene | ~16 | 24 | >336 | 3 | <1 | <1 | — | — | — |
| m-xylene | ~16 | ~16 | 168 | <1 | <1 | — | — | — | — |
| Mesitylene | 3 | 3 | 48 | <1 | — | — | — | — | — |
| Cyclooctane | <1 | 2 | 2 | — | — | — | — | — | — |
| Bicyclohexyl | <1 | <1 | — | — | — | — | — | — | — |
| Methylcyclohexane | <1 | — | — | — | — | — | — | — | — |

*Some viscosity increase noted around 7 days, reduced by shaking sample; a full gel not observed after 14 days.
"P" represents "Precipitated" time rather than gelled.
A "—" represents solvent mixtures that are duplicates of other cells in the table, that is, the ratio of solvent A to solvent B is 1:1, AB = BA.

TABLE 3

Stability of PTDSC16DPPTDC17FT4 solutions at 1 mg/mL.

| | Gel Times (h) Solvent 2 | | | | | | | | |
|---|---|---|---|---|---|---|---|---|---|
| Solvent 1 | Methylcyclohexane | Bicyclohexyl | Cyclooctane | Mesitylene | m-xylene | Toluene | p-Xylene | Tetralin | Decalin (cis + trans) |
| Decalin (cis + trans) | 48 P | ✓ | ✓ | ✓ | ✓ | 64 P | 40 P | 64 P | 40 P |
| Tetralin | ✓ | ✓ | ✓ | ✓ | ✓ | ✓ | ✓ | ✓ | — |
| p-Xylene | 64 P | 64 P | ✓ | 24 P | 16 P | 16 P | 40 P | — | — |
| Toluene | ✓ | ✓ | ✓ | 48 P | 48 P | ✓ | — | — | — |
| m-xylene | 48 P | 48 | ✓ | 24 | 48 P | — | — | — | — |
| Mesitylene | ✓ | ✓ | ✓ | 24 | — | — | — | — | — |
| Cyclooctane | 3 | ✓ | ✓ | — | — | — | — | — | — |
| Bicyclohexyl | 36 | ✓ | — | — | — | — | — | — | — |
| Methylcyclohexane | 36 | — | — | — | — | — | — | — | — |

A "✓" represents greater than 14 days without gelation or precipitation.
A "P" represents "Precipitated" time rather than gelled.
A "—" represents solvent mixtures that are duplicates of other cells in the table, that is, the ratio of solvent A to solvent B is 1:1, AB = BA.

TABLE 4

Stability of PTDSC16DPPTDC17FT4 solutions at 5 mg/mL in different ratios of two solvents.

| | Gel Times (hr) Solvent Ratios | | | | | | | | | | | | |
|---|---|---|---|---|---|---|---|---|---|---|---|---|---|
| Solvents | 100:0 | 95:5 | 90:10 | 80:20 | 70:30 | 60:40 | 50:50 | 40:60 | 30:70 | 20:80 | 10:90 | 5:95 | 0:100 |
| Decalin (cis + trans):Toluene | 16 | 144 | 168 | 192 | 216 | ✓ | 192 | 96 | 24 | 16 | 1 | 0.5 | 0.5 |
| Cyclooctane:Toluene | 0.5 | 48 | 48 | 96 | 168 | 216 | 160 | 72 | 24 | 16 | 1 | 0.5 | 0.5 |

A "✓" represents greater than 14 days without gelation or precipitation.

TABLE 5

Stability of PTDC16DPPTDC17FT4 solutions at different concentrations from 5 mg/mL to 25 mg/mL in 1:1 mixtures of solvents.

| Gel Times (h) Solvents (1:1) | Polymer Concentrations (mg/mL) | | | | |
|---|---|---|---|---|---|
| | 5 | 10 | 15 | 20 | 25 |
| Decalin (cis + trans):Toluene | 192 | 72 | 7 | 5 | 3 |
| Cyclooctane:Toluene | 160 | 24 | 6 | 4 | 2 |

TABLE 6

Device mobility and threshold voltage data for thin film transistors made from different solvent ratio spin-coating inks.

| Solvents Ratio Tetralin:p-Xylene | Max Mobility ($cm^2/Vs$) | Average Mobility ($cm^2/Vs$) | On/Off Ratio | $V_{th}$ (V) |
|---|---|---|---|---|
| 1:0 | 0.16 | 0.14 ± 0.03 | $(5.11 ± 3.38) \times 10^4$ | −5 ± 9 |
| 3:1 | 0.3 | 0.27 ± 0.05 | $(1.01 ± 0.54) \times 10^5$ | −11 ± 11 |
| 0:1 | 0.27 | 0.22 ± 0.05 | $(3.88 ± 2.88) \times 10^4$ | −9 ± 4 |

TABLE 7

Label Key for Solvents shown in FIGS. 1 to 3.

| Label | Solvent |
|---|---|
| A | methylcyclohexane |
| B | bicyclohexyl |
| C | cyclooctane |
| D | mesitylene |
| E | m-xylene |
| F | toluene |
| G | p-xylene |
| H | tetralin |
| I | decalin (cis + trans) |

TABLE 8

Label Key for Solvent Mixtures shown in FIGS. 4 and 5.

| Label | Solvent Mixtures |
|---|---|
| A | decalin (cis + trans):toluene |
| B | cyclooctane:toluene |

What is claimed is:

1. A formulation comprising:
an organic semiconducting polymer selected from the diketopyrrolopyrrole (DPP) and fused thiophene copolymer structures of the formulas (I), (II), or combinations thereof, or salts thereof, in an amount of from 0.1 to 5 wt % based on the total weight of the formulation:

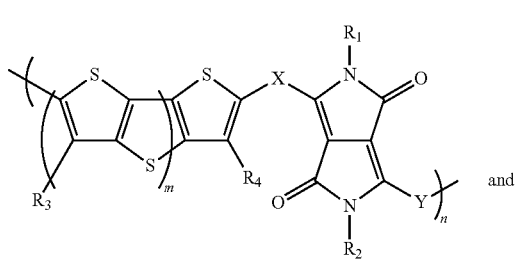

(I)

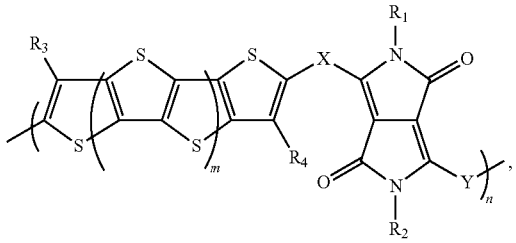

(II)

respectively,
where
m is an integer from 1 to 2,
n is an integer from 4 to 80,
X and Y are independently selected from a divalent heteroaryl,
$R_1$, $R_2$, $R_3$, and $R_4$ is each a monovalent hydrocarbylene substituent independently selected from a group of a saturated or unsaturated, a branched or unbranched, a substituted or unsubstituted ($C_{10-20}$)hydrocarbylene further substituted with a monovalent or divalent saturated or unsaturated cyclic or acyclic ($C_{3-10}$)hydrocarbylene,
a first solvent selected from a cyclic aliphatic in an amount of from 2 to 98 wt % based on the total weight of the formulation; and
a second solvent selected from an aromatic in an amount of from 98 to 2 wt % based on the total weight of the formulation, wherein the volume ratio of the first solvent to the second solvent is from 75:25 to 25:75.

2. The formulation of claim 1, wherein the organic semiconducting polymer of the formula (II) is a diketopyrrolopyrrole (DPP) and fused thiophene copolymer structure of the formula (III):

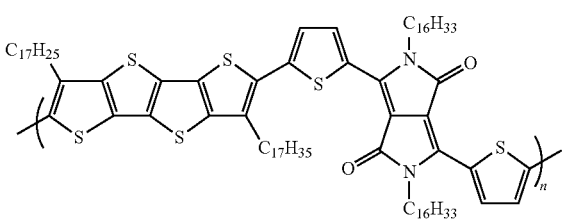

(III)

where
n is an integer from 4 to 60.

3. The formulation of claim 1, wherein the
first cyclic aliphatic solvent is selected from cis-decalin, trans-decalin, mixed cis- and trans-decalin, cyclooctane, bicyclohexyl, methylcyclohexane, or mixtures thereof, in an amount of from 2 to 98 wt %, based on the total weight of the formulation; and
second aromatic solvent is selected from toluene, m-xylene, p-xylene, o-xylene, mesitylene, tetralin, or mixtures thereof, in an amount of from 98 to 2 wt%, based on the total weight of the formulation, and the weight ratio of the first solvent to the second solvent is from 75:25 to 25:75.

4. The formulation of claim 1, wherein
the first solvent is decalin, and
the second solvent is toluene, and the weight ratio of the first solvent to the second solvent of 75:25 to 40:60.

5. The formulation of claim 1, wherein
the first solvent is cyclooctane, and
the second aromatic solvent is toluene, in a weight ratio of 75:25 to 40:60.

6. The formulation of claim 1, wherein
the first solvent is cyclooctane, and
the second aromatic solvent is tetralin, in a weight ratio of 75:25 to 40:60.

7. The formulation of claim 1, further comprising a viscosity modifier, a viscosity improver, a surface tension modifier, a fugitive surface tension modifier, a tenside, a surfactant, or mixtures thereof.

8. The formulation of claim 1, wherein the polydispersity of the polymer of formula (I) or (II) is from about 1 to 3.

9. The formulation of claim 2, wherein the polydispersity of the polymer of formula (III) is from about 1.5 to 2.5.

10. The formulation of claim 1, wherein the shelf life before gelation of the solution at ambient conditions is from 7 to 20 days.

11. The formulation of claim 10, wherein the shelf life before gelation of the solution at ambient conditions is from 14 to 20 days.

12. A method of making an electronic device, comprising:
depositing the formulation of claim 1 on a suitable substrate.

13. The method of claim 12, wherein depositing is accomplished using spin-coating, ink-jet printing, gravure printing, transfer printing, or combinations thereof.

* * * * *